(12) United States Patent
Bezama et al.

(10) Patent No.: US 8,505,617 B2
(45) Date of Patent: Aug. 13, 2013

(54) STRUCTURE AND APPARATUS FOR COOLING INTEGRATED CIRCUITS USING COPPER MICROCHANNELS

(75) Inventors: Raschid Jose Bezama, Yorktown Heights, NY (US); Evan George Colgan, Yorktown Heights, NY (US); Madhusudan K. Iyengar, Yorktown Heights, NY (US); John Harold Magerlein, Yorktown Heights, NY (US); Roger Ray Schmidt, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/423,659

(22) Filed: Mar. 19, 2012

(65) Prior Publication Data
US 2012/0175100 A1 Jul. 12, 2012

Related U.S. Application Data

(62) Division of application No. 12/177,020, filed on Jul. 21, 2008, now Pat. No. 8,210,243.

(51) Int. Cl.
*F28F 7/00* (2006.01)
*H05K 7/20* (2006.01)

(52) U.S. Cl.
USPC .................................... 165/80.4; 165/80.3

(58) Field of Classification Search
USPC ................ 165/80.4, 80.3, 104.33, 146, 147; 361/698, 699, 703; 257/714
See application file for complete search history.

(56) References Cited

U.S. PATENT DOCUMENTS

| | | | | |
|---|---|---|---|---|
| 4,561,040 A | * | 12/1985 | Eastman et al. | 361/699 |
| 4,835,658 A | * | 5/1989 | Bonnefoy | 361/692 |
| 5,388,635 A | * | 2/1995 | Gruber et al. | 165/80.4 |
| 5,592,363 A | * | 1/1997 | Atarashi et al. | 361/689 |
| 7,213,636 B2 | * | 5/2007 | Bhatti et al. | 165/80.4 |
| 7,414,843 B2 | * | 8/2008 | Joshi et al. | 361/699 |
| 2006/0002088 A1 | * | 1/2006 | Bezama et al. | 361/702 |
| 2008/0264604 A1 | * | 10/2008 | Campbell et al. | 165/80.4 |
| 2009/0283244 A1 | * | 11/2009 | Bezama et al. | 165/80.4 |

* cited by examiner

*Primary Examiner* — Tho V Duong
(74) *Attorney, Agent, or Firm* — F. Chau & Associates, LLC; Louis J. Percello, Esq.

(57) ABSTRACT

A cooler having a unitary construction including a channel portion including a plurality of fins on a base, the plurality of fins defining a plurality of microchannels therebetween, a tapered opening formed in a set of the plurality of fins, a manifold portion disposed on an edge portion of the base, the manifold portion including an inlet port and an outlet port disposed above the tapered opening in the plurality of fins, and a separator sheet including at least two elongated openings disposed between the channel portion and the manifold portion.

6 Claims, 9 Drawing Sheets

Section Y-Y

Fig. 3E

Fig. 3I
Section A-A

Fig. 3J
Section B-B

Fig. 3K
Section C-C

Fig. 3L
Section D-D

Fig. 3H

STRUCTURE AND APPARATUS FOR COOLING INTEGRATED CIRCUITS USING COPPER MICROCHANNELS

CROSS REFERENCE TO RELATED APPLICATIONS

This application is a Divisional Application of U.S. application Ser. No. 12/177,020, filed on Jul. 21, 2008, the disclosure of which is herein incorporated by reference in its entirety.

BACKGROUND OF THE INVENTION

1. Technical Field

The present disclosure relates to apparatus and structures for cooling electronic devices. More specifically, the present disclosure relates to copper microchannel cooling apparatus and structures for cooling integrated circuits.

2. Discussion of Related Art

As heat is generated during the functioning of integrated circuit chips (ICs), the thermal resistance from the chip junction to the ambient air or circulating cooling fluid needs to be small enough to achieve sufficient cooling of the chip to assure reliable operation of the device. The problem of heat removal from the chip becomes more difficult as chip geometry is scaled down and operating speeds are increased, resulting in increased power density. The ability to cool the chips can therefore be a limiting factor in the further increase of system performance. In many systems, air cooling is not possible due to high power density or to space and air flow limitations. One approach to avoiding the limitations of conventional air cooling is to use a cooling liquid.

Various heat removal techniques have been developed for cooling semiconductor chips, including heat removal techniques for cooling single chip modules (SCMs) or multiple chip modules (MCMs). For example, silicon microchannel cooling has been demonstrated for cooling high power densities (e.g., >500 W/cm$^2$) in SCMs. Limitations of heat removal techniques result from, for example, Silicon construction that can be weak, components which are expensive to fabricate, and pressure drops and non-uniform flow distribution due to manifold design limitations.

Therefore, a need exists for a copper microchannel cooling apparatus and structures for cooling integrated circuits.

BRIEF SUMMARY

According to an exemplary embodiment of the present invention, a cooler having a unitary construction including a channel portion including a plurality of fins on a base, the plurality of fins defining a plurality of microchannels therebetween, a tapered opening formed in a set of the plurality of fins, a manifold portion disposed on an edge portion of the base and covering the channel portion, the manifold portion including an inlet port and an outlet port which are in fluid connection with respective tapered inlet and outlet manifold channels, and a separator sheet including at least two elongated openings disposed between the channel portion and the tapered inlet and outlet manifold channels of the manifold portion where at least one of the elongated openings is aligned with a portion of the at least one tapered opening formed in a set of the plurality of fins, wherein distribution channels of the manifold portion are located above an active cooled portion of the plurality of fins, and wherein inlet and outlet channels of the manifold portion are located above the separator sheet.

According to an exemplary embodiment of the present invention, a cooler having a unitary construction including a channel portion including a plurality of fins on a base, the plurality of fins defining a plurality of microchannels therebetween, at least one tapered opening formed in a set of the plurality of fins which does not extend across all the fins, a manifold portion disposed on an edge portion of the base and covering the channel portion, the manifold portion including an inlet port and an outlet port which are in fluid connection with respective tapered inlet and outlet manifold channels, and distribution channels for flowing coolant from the inlet port through the microchannels and to the outlet port, and a separator sheet including at least two elongated openings disposed between the channel portion and the tapered inlet and outlet manifold channels of the manifold portion, wherein distribution channels of the manifold portion are located above an active cooled portion of the plurality of fins, and wherein inlet and outlet channels of the manifold portion are located above the separator sheet.

BRIEF DESCRIPTION OF THE SEVERAL VIEWS OF THE DRAWINGS

Preferred embodiments of the present disclosure will be described below in more detail, with reference to the accompanying drawings.

DETAILED DESCRIPTION

Hereinafter, exemplary embodiments of the present invention will be described with reference to the accompanying drawings.

In various exemplary embodiments of the present invention, copper microchannel cooling structures have a unitary construction and are connected in a parallel flow arrangement, with a manifold design for improved fluid distribution and cooling of integrated circuit (IC) chips.

Copper has a significantly higher thermal conductivity than silicon (about 2.6 times) but is more difficult to form into high aspect ratio microchannels. In various exemplary embodiments of the present invention, the copper microchannels have channel widths below about 100-200 microns, fin widths below about 100-200 microns, and fin heights of about 1 mm or more.

Figure 1:
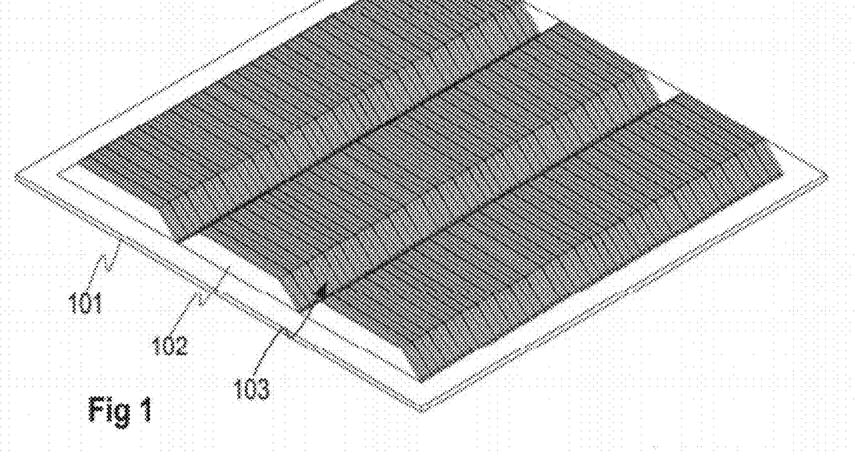
FIG. 1 is a schematic perspective view of a channel portion of an apparatus for microchannel cooling a semiconductor chip according to an exemplary embodiment of the present invention.

FIG. 1 is a schematic perspective view that illustrates a channel portion of an apparatus for microchannel cooling a semiconductor chip according to an exemplary embodiment of the invention. Such a structure would preferably be formed from copper and could be fabricated by skiving, sawing, metal injection molding, electrical discharge machining, laser assisted chemical etching, electroforming or other means. A thickness of a base 101 is preferably in the range of about 0.5 to 2.0 mm thick, the fins 102 preferably have channel widths (e.g., widths between adjacent fins) below about 200 microns, or more preferable below about 100 microns, fin widths are below about 200 microns, or more preferable below 100 microns, and fin heights from the base 101 of 1 mm or more. One difficulty of previous structures is that removing the fins in the region below the fluid inlet/outlet manifolds reduces the thermal performance, but it is desirable to remove the fins under the inlet/outlet manifolds to reduce the pressure drop, improve the flow uniformity, and allow the fluid to be more readily directed into and removed from the microchannels. In FIG. 1, in a region under the inlet/outlet manifolds 103, the ends of the fins 102 are tapered so as to allow the fluid to be readily coupled into or out of the channels while only a portion of the fins are removed, so the reduction of the thermal performance is reduced. The tapering of the fins in region 103 is most effective for inlet/outlet regions, which are interior to the actively cooled area (i.e. fin & channel region). Although the fins are shown to be tapered at two opposite edges of the fin portion, the cooler can be designed so that the inlet/outlet regions at the ends are outside, or on the edge of, the actively cooled area, wherein the tapering would be most effective for edge regions of the actively cooled area. The tapering may be implemented accordingly, e.g., being implemented for the interior inlet/outlet regions and/or the edge regions.

Figure 2A:
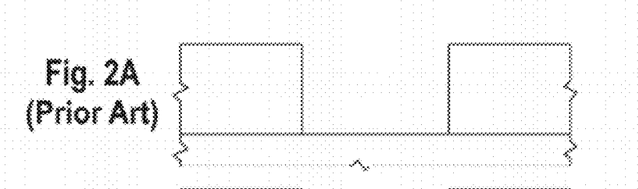
FIG. 2A is schematic side view of the conventional fin structure in the regions under the inlet and outlet manifolds.
Figure 2B:
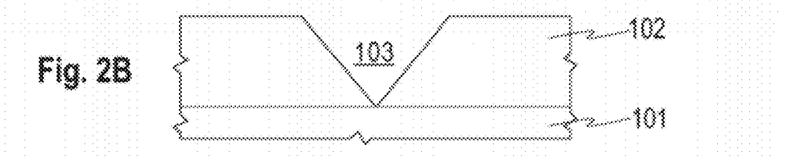
FIGS. 2B-D are schematic side views of the fin structure in the regions under the inlet and outlet manifolds according to an exemplary embodiment of the present invention.
Figure 2C:
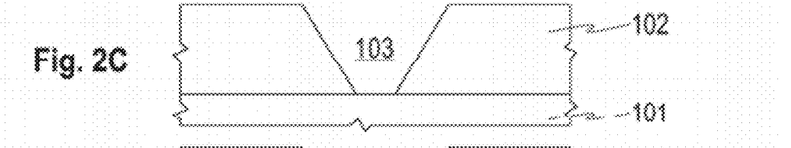
Figure 2D:
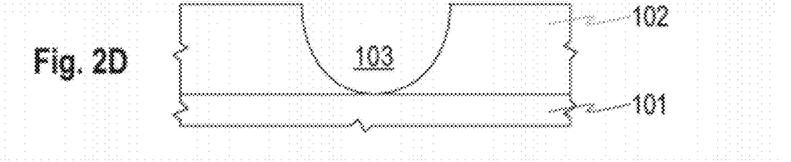

Referring to FIGS. 2A-D, which are schematic side views of the fin structure in the regions 103 under the interior inlet or outlet manifolds, FIG. 2A is the conventional structure where the fins are fully removed from the region and the ends of the fins are vertical relative to the base, FIG. 2B is the angled configuration shown in FIG. 1, FIG. 2C is an angled configuration where the fins 102 are fully removed from a portion of the area under the manifolds 103, and FIG. 2D is a configuration where the ends of the fins 102 are curved instead of tapered. In the preferred embodiments FIGS. 2B-D, the tops of the fins 102 are removed in the region 103, or part of the region, under the inlet/outlet manifolds, and the width of the region 103 where the fins are removed varies as a function of the vertical distance up the fins, away from the base 101, and is less at the base of the fins than at the top of the fins. Other configurations than those shown in FIGS. 2B-D are possible such as at no point removing the fins fully down to the base, having multiple curved or straight segments when viewed in cross section, etc. For a configuration such as is shown in FIG. 2C, the width of the region 103 where the fins are fully removed is less than about twice the thickness of the base 101 so that thermal spreading in the base 101 will provide cooling for these regions.

Figure 3A:
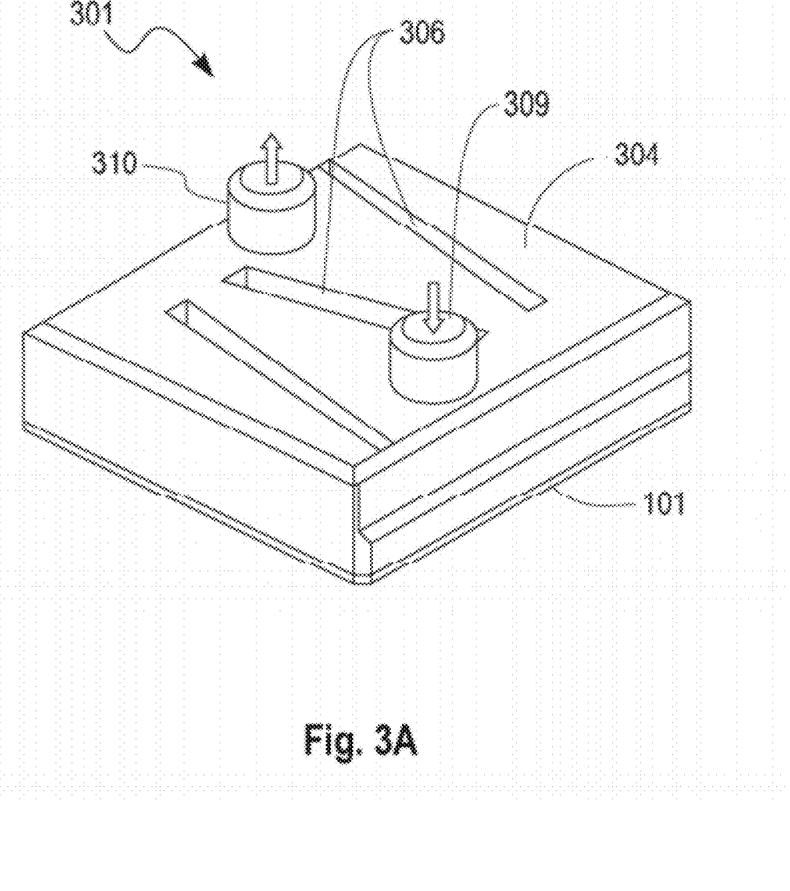
FIGS. 3A-C are perspective views of an assembly according to an exemplary embodiment of the present invention.
Figure 3B:
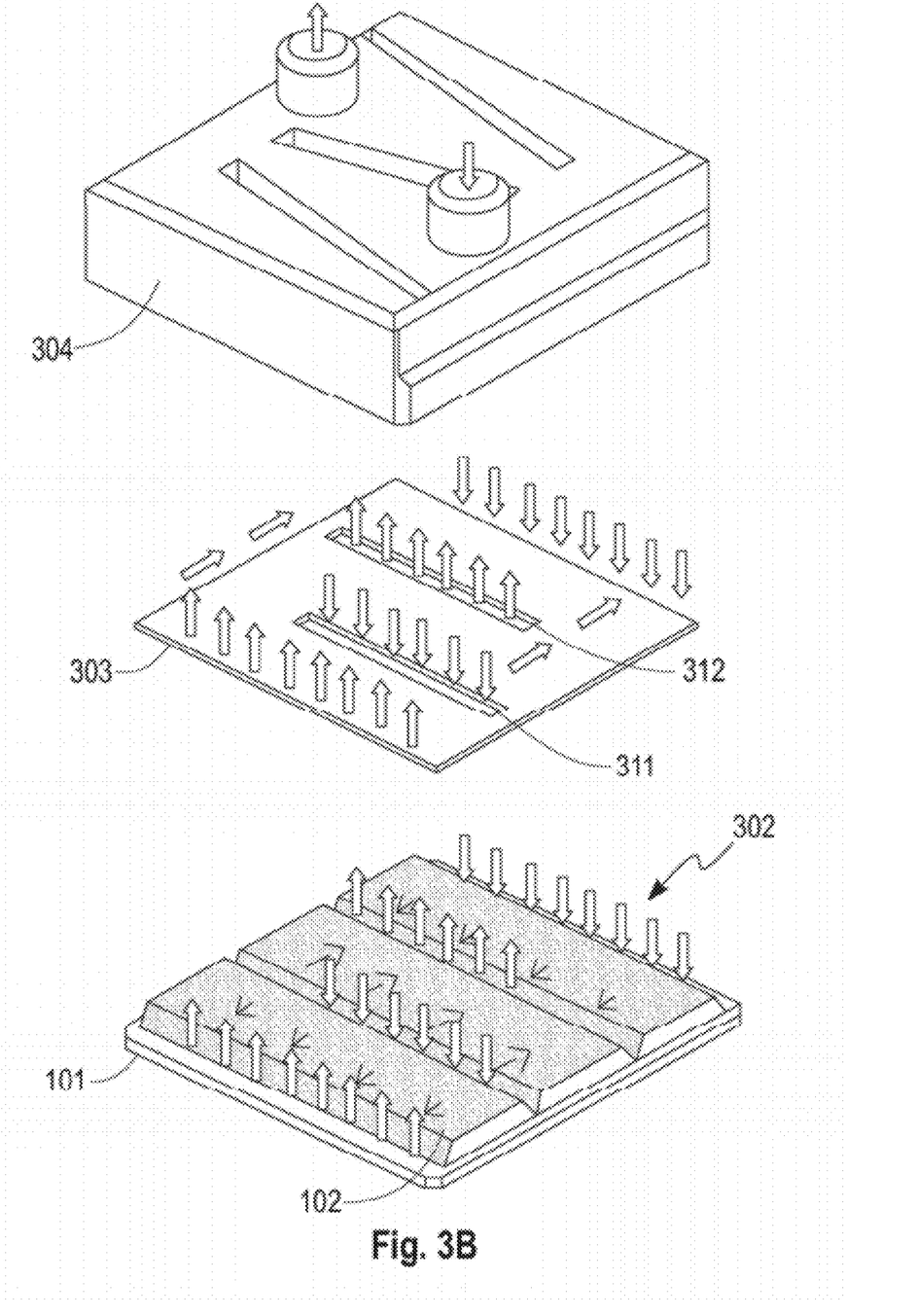
Figure 3C:
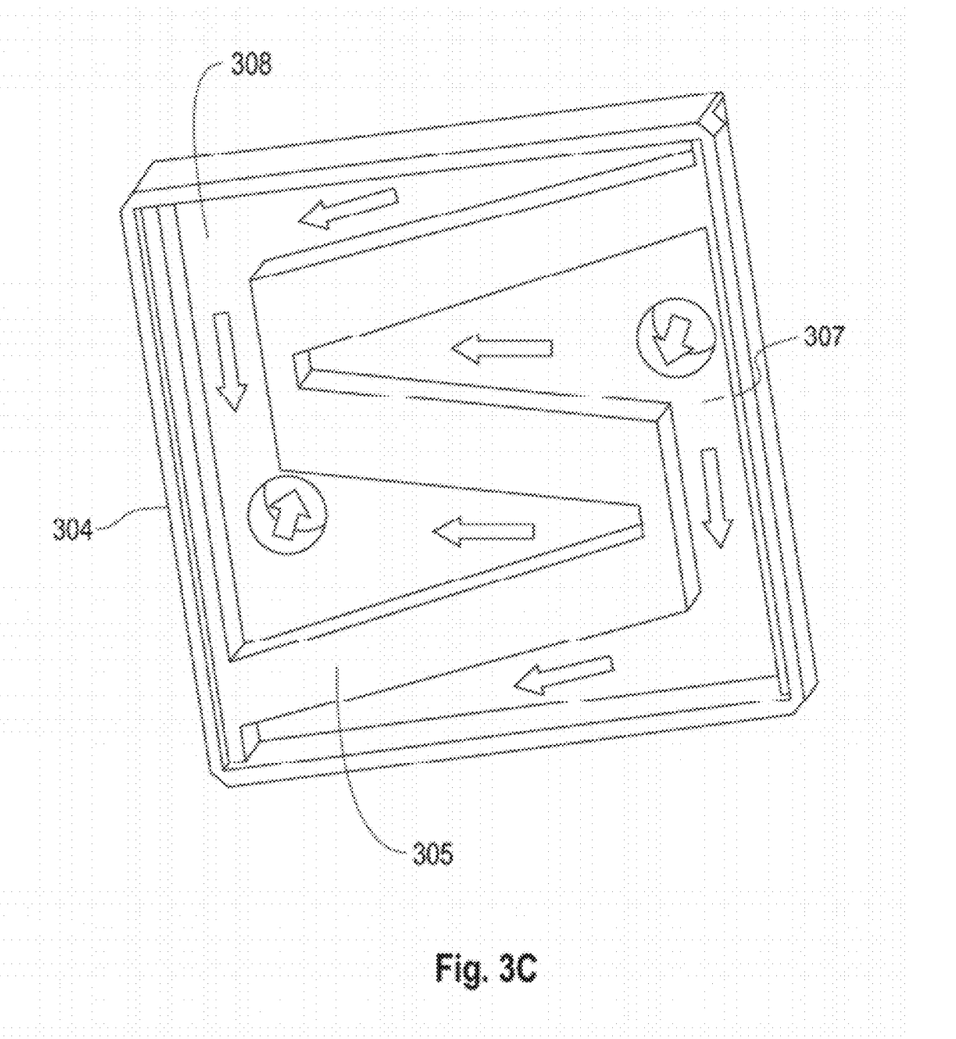
Figure 3D:
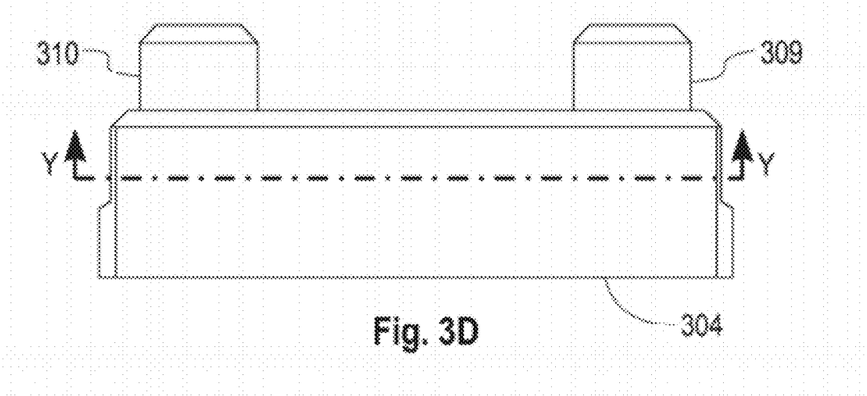
FIG. 3D is a side view of an assembly according to an exemplary embodiment of the present invention.
Figure 3E:
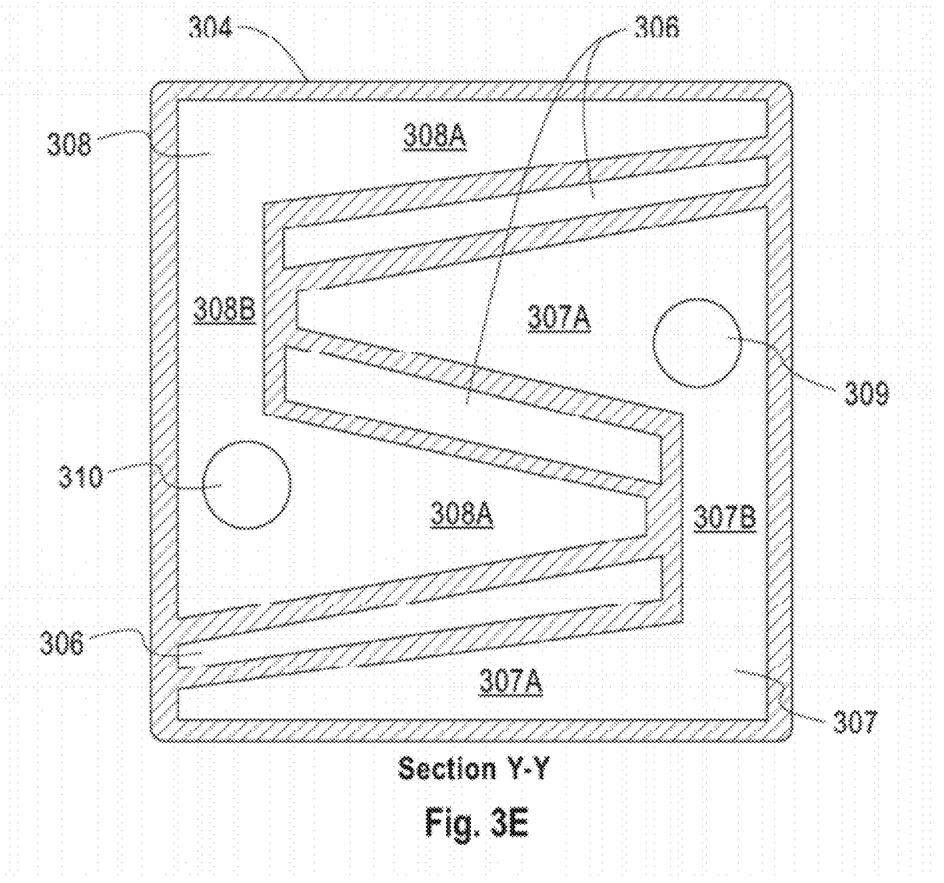
FIG. 3E is a horizontal section view of an assembly according to an exemplary embodiment of the present invention.
Figure 3F:
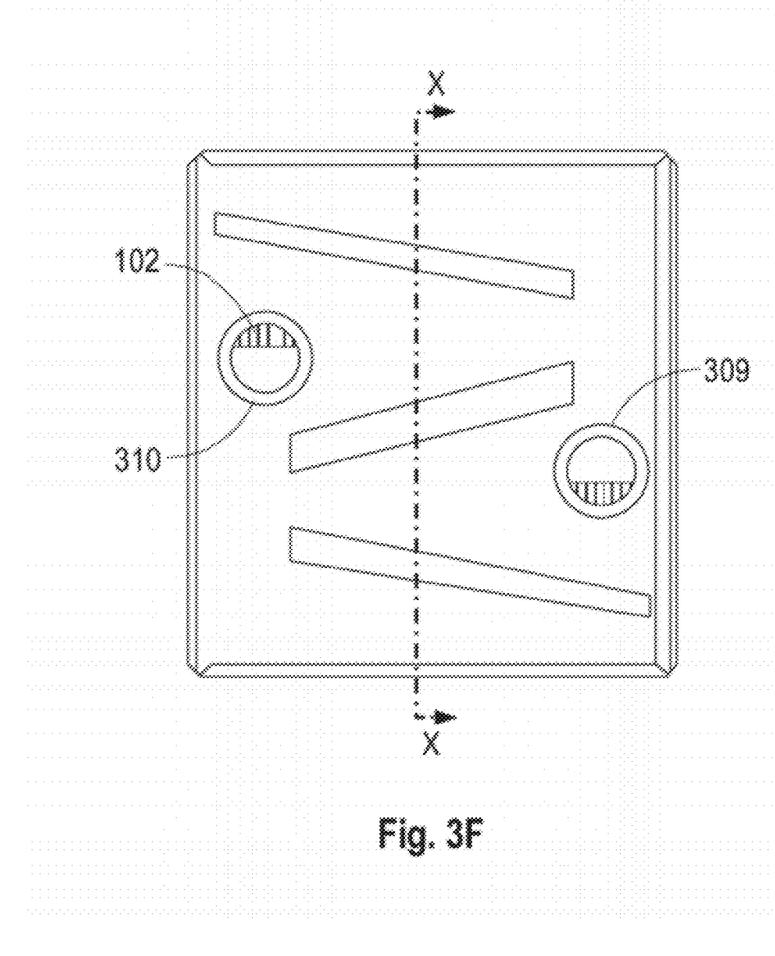
FIG. 3F is a top view of an assembly according to an exemplary embodiment of the present invention.
Figure 3G:
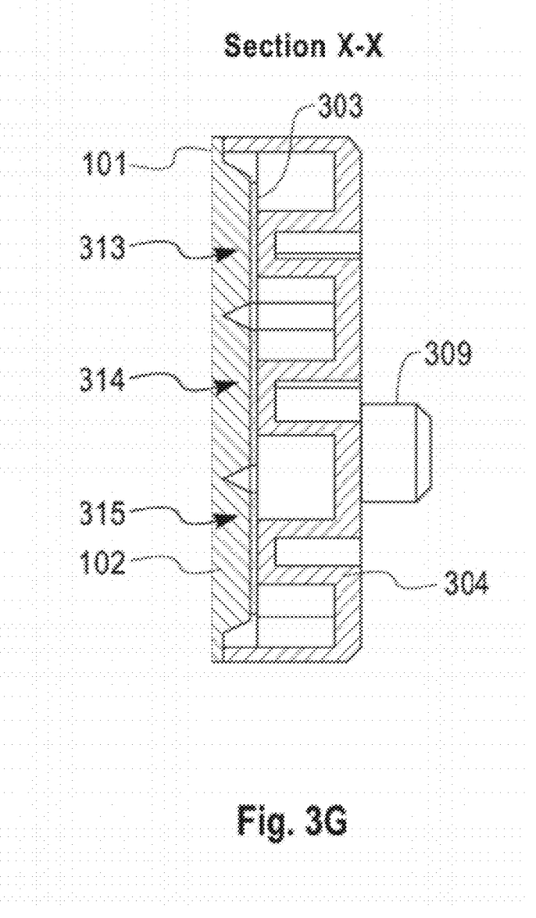
FIG. 3G is a cross-section view of an assembly according to an exemplary embodiment of the present invention.
Figure 3H:
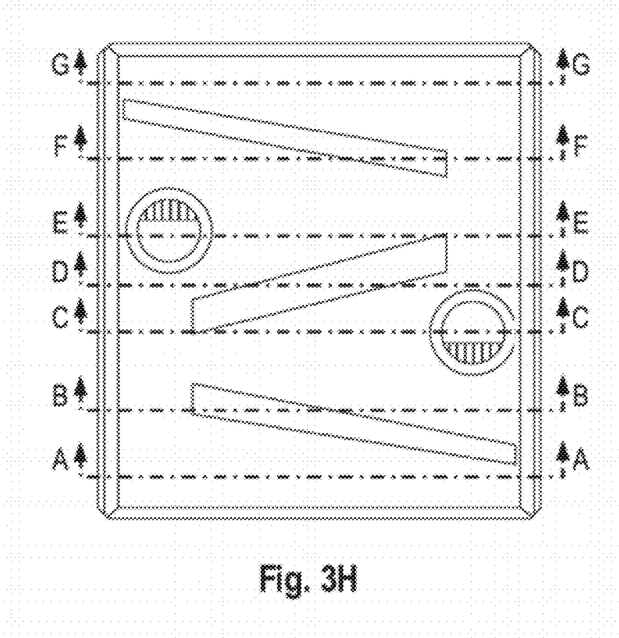
FIG. 3H is a top view of an assembly according to an exemplary embodiment of the present invention.
Figure 3I:
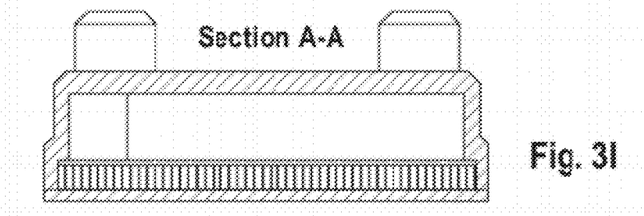
FIGS. 3I-O are cross-section views of an assembly according to an exemplary embodiment of the present invention.
Figure 3J:
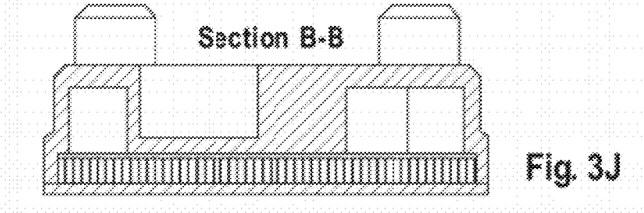
Figure 3K:
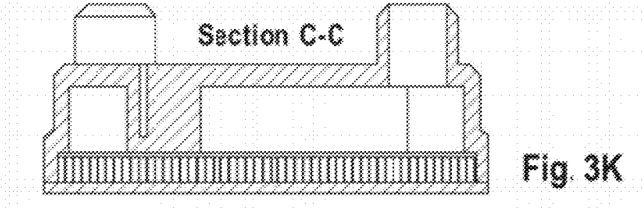
Figure 3L:
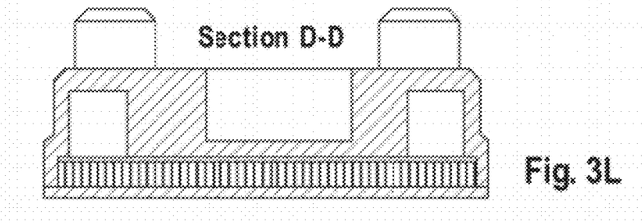
Figure 3M:
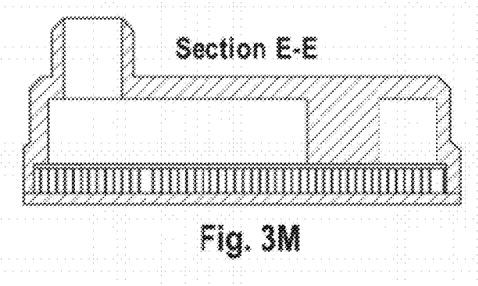
Figure 3N:
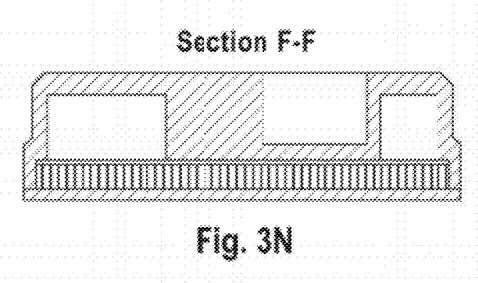
Figure 3O:
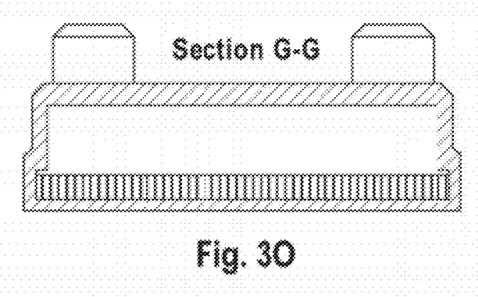

The complete structure of an exemplary cooler can be understood with reference to FIGS. 3A-O illustrating views of the complete assembly, the cover/manifold portion, the channel portion, and the separator sheet along with the fluid flow paths. FIGS. 3A-B show the complete assembly 301 along with an exploded view of the fin portion 302, separator 303, and cover/manifold portion 304. FIG. 3C shows a perspective bottom view of the manifold portion 304. In the figures, arrows are used to show the fluid flow paths from the inlet to the outlet. FIGS. 3D and 3E show a side view and a horizontal section through the manifold portion 304. The manifold portion is preferably formed as a shell of material to minimize the thermal coupling between the coolant fluid in the inlet 307 and outlet 308 manifolds; note the manifold partition portion 305 and the recesses 306 in FIG. 3A and FIG. 3E between the inlet 307 and outlet (exhaust) 308 paths/manifolds. As shown in FIG. 3E, the inlet 307 and outlet 308 paths include tapered inlet/outlet manifold channels 307A/308A and vertical distribution channel portions 307B/308B. The manifold portion 304 can be formed by stamping, coining, or deep drawing from a sheet of metal or by metal injection molding, or by other means. Note that the manifold portion 304 does not have to be formed as a shell, but could be formed without the recesses 306 by conventional machining, casting, or by other means. Fluid inlet/outlet ports 309/310 can be threaded for attachment of a fitting which connects to a hose or tube. Alternately, a barb fitting could be directly attached or integrated onto the manifold portion.

The inlet and outlet/exit ports 309/310 are each connected directly to a tapered inlet/outlet manifold channel portion 307A/308A of the manifolds 307/308 and to a vertical distribution channel portion 307B/308B of the manifolds 307/308 which is connected to a second tapered inlet/outlet manifold channel 307A/308A. The distribution channels 307B/308B run parallel to the channels in the channel portion and have a constant cross section, as they each only feed one additional manifold channel, and the manifold channels 307A/308A run perpendicular to, i.e., across, the channels in the channel portion and are tapered, (i.e., the cross sectional area is reduced along the flow direction of the inlet manifolds 307A and is increased along the flow direction of the outlet manifolds 308A). Note that the inlet/outlet ports 309/310 can be located at points along the distribution channels 307B/308B or near the other junctions of the inlet/outlet manifolds 307A/308A and distribution channels 307B/308B. The locations should be symmetric so that a uniform coolant flow is provided to all the channels. Note that the inlet/outlet manifold channels 307A/308A do not extend fully across the fin and channel area of the channel portion 302 but stop so as to allow space for a manifold partition portion 305 and the distribution channel 308B/307B to also be positioned above the fin & channel area of the channel portion 302. The inlet/outlet manifold channels 307A/308A can be designed so that the cross sectional area is approximately equal to the cross sectional area of the microchannels to which they provide, or receive, coolant fluid. This can be achieved by tapering the manifold channels either in width, height, or both. In FIG. 3A-C, the manifold channel width is tapered and the height is kept constant. Note that the height of the manifold 307A/308A and distribution 307B/308B channels are significantly greater (e.g., 2-3×) than the height of the microchannels as this allows an adequate cross sectional area to be provided while also having the manifold channels 307A/308A in the manifold portion extend across and directly provide coolant fluid to most of the channels on the channel portion through the separator sheet 303 (see FIG. 3B).

Another component of the cooler is the separator sheet 303, shown in FIG. 3B. This is preferably a thin metal sheet, such as copper, which can be formed by stamping or punching. If the tolerances on the height of the fins, depth of the cavity for receiving the fins in the manifold portion, etc. are not well enough controlled, the separator sheet 303 can be composed of a compliant flexible polymer material such as a fluoroelastomer, silicone elastomer, etc., or be composed of a combination of layers where a compliant flexible polymer layer or layers are stacked with a thin metallic sheet. Note that the compliant polymer material should be selected to be compatible with a 260° C. reflow temperature if the cooler will go through a BGA (ball grid array) reflow step, but a number of such materials exist. The separator sheet 303 prevents, or minimizes, any fluid flow between the tops of the fins 102 and the manifold portion 304, and seals the distribution channels 307B/308B from both the channels below on the channel portion and laterally from the end of the manifold channel 308A/307A which approaches the distribution channel. The gap between the top of the fins and the separator sheet should be less than the channel width to avoid having a "short-circuit" flow which would reduce the performance of the cooler. Depending on the fabrication methods used for the channel portion and manifold portion, achieving such tolerances maybe difficult or significantly increase the component costs, in which case a separate sheet using a compliant polymer layer or layers can be used. If there is a significant variation in the height of the fins 102, a compliant polymer layer should be located facing them. If there is a significant variation in the flatness of the manifold portion 304 which is located directly over the fins 102, a compliant polymer layer should be located facing that surface. So if polymer layers are needed on both sides, either a single compliant polymer layer maybe used, or two compliant polymer layers with a thin metal sheet in between them.

The separator sheet 303 spans regions where the fins are removed while also sealing the distribution channels 307B/308B. Depending on the dimensions and properties of the complaint polymer layer, using a thin metal sheet in combination with one or more compliant polymer layers maybe required to increase the stiffness of the separator sheet so that it will provide sealing of the distribution channels over regions where the tops of the fins are removed. Note that a further option to insure sealing of the distribution channel is to attach, seal, or bond the separator sheet to the manifold portion. This could be done either with an adhesive bonding means such as a silicone adhesive, epoxy adhesive, etc., or a metallic bonding means such as solder, brazing, etc.

Aligned with the regions where the fins are removed are elongated openings 311/312 in the separator sheet 303. The elongated openings 311/312 have a width substantially equal to an upper width of the tapered openings 103 (e.g., the largest width of the tapered openings) and a length less than a length of the tapered openings, wherein the least two elongated openings may be partially offset from one another—the position of the elongated openings 311/312 is offset substantially perpendicular to a length of the fins. This offset is provided to allow space for a manifold partition portion 305 and the distribution channel 308B/307B to also be positioned above the fin & channel area of the channel portion 302.

The functioning of the cooler structure can be understood with reference to FIGS. 3A-O. The use of a separator sheet 303 permits the distribution channels 307B/308B to be located fully over the area which is actively cooled (i.e., contains fins and channels) which reduces the overall x-y size of the cooler. The manifold channels are also located over the actively cooled area except at the two ends of the fins adjacent to the edge of the fin portion where they may extend beyond the fins and provide/collect fluid to/from the channels. The manifold 304 and channel portions 302 are preferentially fabricated from a metallic material, more preferably from copper and are joined together by a metallic bonding means such as a solder, braze, weld, or other direct metal-to-metal bond to form a unitary structure. In the embodiment in FIG. 3A-G, the separator sheet 303 is located inside of the manifold 304 and channel portions and a unitary cooler is formed by joining the manifold 304 and channel portions 302 together. Other configurations are possible where the seal between the channel portion 302 and the manifold portion 304 is approximately level with, or above, the tops of the fins and a metallic separator sheet 303 extends outward to the outer surface of the cooler and the channel and manifold portions 302 and 304 are each bonded to the separator sheet. In a preferred configuration shown in FIG. 3A-F, the sealing of the distribution channels 307B/308B is provided by the separator sheet which is located between the tops of the fins and the bottom of the manifold portion 304. Since the outer most fins are used to provide part of the seal for the distribution channel, this requires the distribution channels 307B/308B to be over the active area of the cooler. Note that the separator sheet 303 is removed over the ends of the fins along the top and bottom edges of the cooler to allow the fluid to flow to and from the inlet/outlet manifolds 307A/308A, see FIGS. 3F-G which is a top view and vertical section through the assembly. FIGS. 3H and 3I-O provides a top view and multiple vertical sections through the assembly where the sections are perpendicular to the section shown in FIG. 3F-G.

In operation, the coolant fluid would flow into the inlet port, and then either directly into the inlet manifold 307A across the center of the cooler, or through the distribution channel 307B to the second inlet manifold 307A across one end of the cooler. After flowing down through the opening in the separator sheet and into a channel in the channel portion of the cooler, it would return through the separator sheet into an exit manifold channel 308B and to the outlet port.

Figure 4:
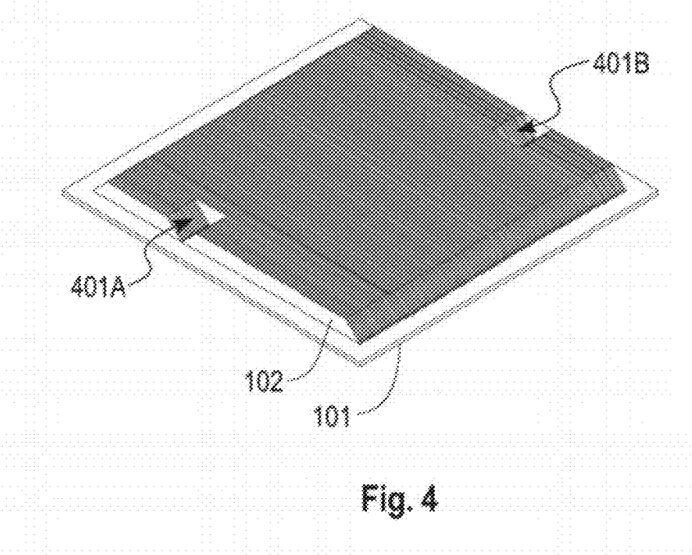
FIG. 4 is a schematic perspective view of the channel portion of an apparatus for microchannel cooling a semiconductor chip according to an alternate exemplary embodiment of the present invention.

An alternate embodiment of the channel portion is shown in FIG. 4, which is a schematic perspective view that illustrates the channel portion of an apparatus for microchannel cooling and is similar to FIG. 1 except that the fins 102 are only removed in the regions 401A and 401B which are partially under the elongated openings 311/312 in the separator sheet 303 and extend under the manifold partition portions 305 and the distribution channels 308B/307B to allow fluid flow to/from fins 102 which are laterally offset from the elongated openings 311/312 in the separator sheet 303. The channel portion configuration shown in FIG. 4 would need to be mirrored left-to-right to align with the manifold portion 304 and separator sheet 303 configurations shown in FIG. 3B Further embodiments are possible which would correspond to a combination of the configurations shown in FIG. 4 where a larger portion of the fins 102 would be removed in the regions 401A and 401B under the partition portions 305 and the distribution channels 307B/308B and partially under the elongated openings in the separator sheet and that the amount of fin material removed as the outer most cooling channel is approached could be reduced to minimize the amount of fin area lost.

Compared to the embodiment illustrated in FIG. 1, the pressure drop will be somewhat increased due to the increased difficulty of the fluid redistribution into the channels from the manifolds, but the thermal performance maybe enhanced as there is a larger available fin area for heat transfer.

For exemplary embodiments shown herein, the coolers have 3 heat exchanger zones, see FIG. 3G, 313-315, (i.e., two inlet manifolds and two outlet manifolds) but the disclosed structure can be extended to support a larger number of heat exchanger zones if desired. If a larger number of heat exchanger zones are used, the distribution channel may be piece-wise tapered. The cross sectional area between adjacent tapered manifold channels will be constant, but the cross sectional area of each segment of the distribution channels will decrease as one moves along the distribution channels away from the inlet or outlet ports. If five heat exchanger zones are used with the inlet and outlet ports align at the junction of the corresponding center manifold channels and distribution channels, all the distribution channels would have the same cross sectional area.

Figure 5:
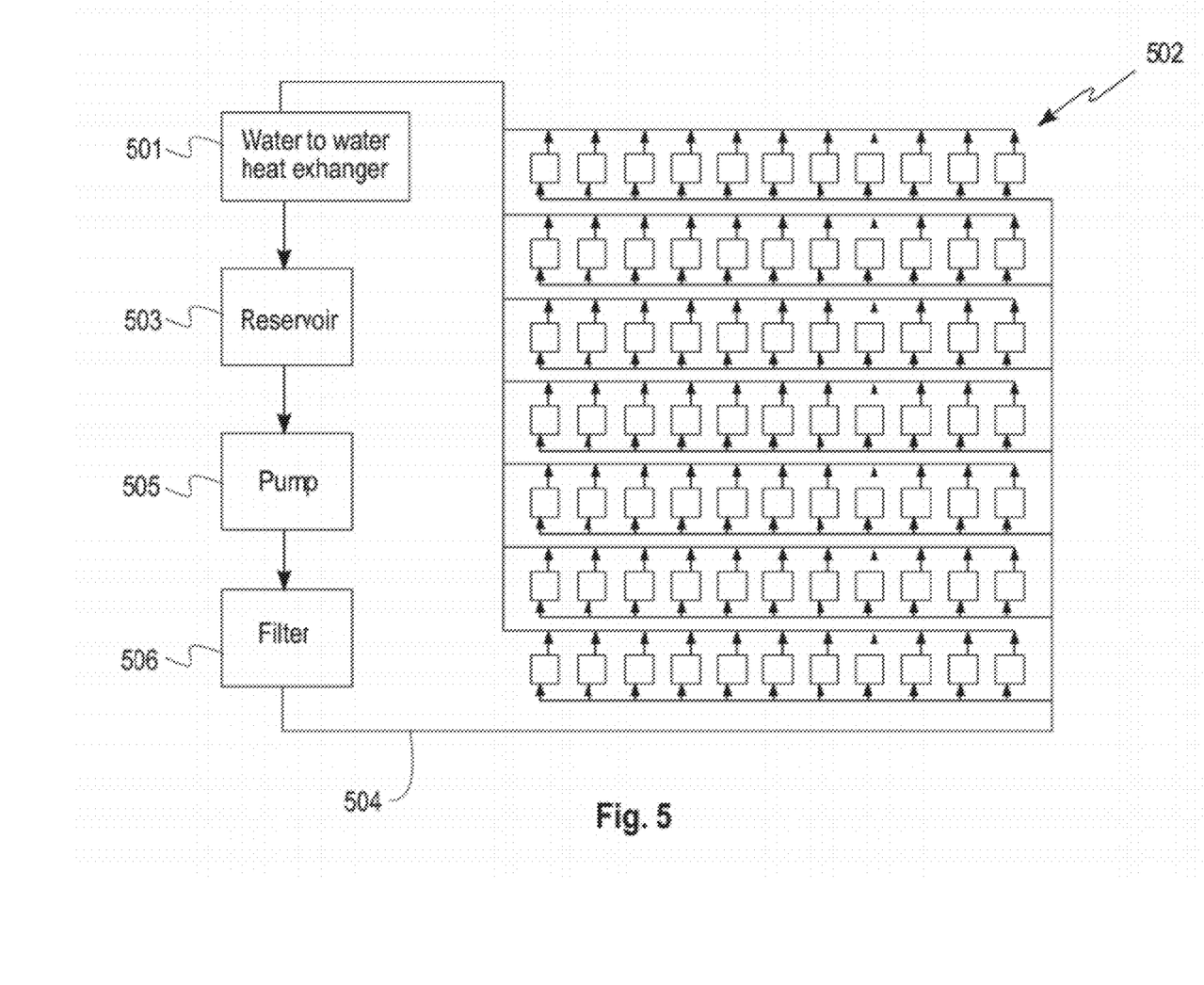
FIG. 5 is a schematic diagram of a cooling loop where liquid cooled modules are connected in parallel across inlet and outlet supply pipes.

In order to understand why there is an optimum flow resistance for the cooler, consider the case of high performance computer rack environments, where one-hundred or more high performance processor chips can require direct water cooling. A schematic of an exemplary arrangement of such a cooling system is shown in FIG. 5. A water to water heat exchanger 501 is used to remove heat, and eject the heat to externally chilled water, and control the temperature of the water which is being circulated through the computer rack 502. A reservoir 503 is provided to allow for expansion and contraction of the water contained in the loop 504. A pump 505 is used to circulate the cooling water and a filter 506 is located after the pump 505 to remove particles from the cooling water which might cause blockages in the fine channels in the coolers. Other components, such as means for purging air from the system, draining the system, etc. are not shown. The heat exchanger 501, reservoir 503, pump 505, filter 505, etc., of FIG. 5 may be packaged is a separate support rack, not in the same rack as the computer system 502. An exemplary arrangement of the coolers is to connect them in parallel between a system of inlet and outlet pipes. The individual processor chips can be packaged in small enclosures such as "blades" which may be connected electrically to a backplane in the computer rack and dripless quick connects would be used for the fluid connections of the individual blades to the inlet and outlet pipes. Such a configuration allows easy servicing and the removal and replacement of individual blades without shutting down the whole computer rack.

To substantially insure a uniform distribution of water to each cooler of FIG. 5, a substantially uniform and equal flow resistance for each path between the inlet and outlet pipes is needed. It is assumed that the pipes are sized such that the pressure drop attributable to them is negligible and further the plumbing is arranged so that the flow length in the inlet/outlet pipes is substantially equivalent for each of the coolers. Having a substantially uniform distribution can minimize the flow needed. Variations in the flow resistance can be potentially caused by the dripless quick connects and different hose lengths or bend angles. To substantially ensure a uniform flow distribution, the cooler design has a flow resistance in the range of about 2 to 7 psi (pounds per square inch) at a flow rate adequate to limit the temperature rise in the water from circulating through the computer rack to between about 2 and 10 Celsius (C) and more preferably between 4 and 8 C. For example if the rack contained 144 processors, each of which dissipates 400 Watts (W), the total direct water cooled heat load would be 36 kW. With a water temperature rise of 5 C., a total coolant flow rate of about 104 liters/minute would be needed for the rack, or about 0.7 liters/minute for each processor. By ensuring that the cooler provides the dominant portion of the flow resistance between the inlet and outlet connection to the computer rack, substantially more (i.e. at least 2× and preferably 3×) than the variations in the pressure drop, the uniformity of the flow distribution is substantially dependent on the uniformity of the pressure drop in the individual coolers, which can be tested in advance prior to assembly. An exemplary pump 505 of FIG. 5 has a pressure difference between the inlet and outlet of about 15 to 20 psi. Considering the other components in the system, the available pressure drop for the coolers is about 7 psi or less, more preferable about 3 to 5 psi.

A microchannel cooler can be broken into multiple heat exchanger zones, between alternating inlet and outlet manifolds, to reduce the pressure drop. The length of each heat exchanger zone (i.e., the distance between inlet and outlet manifolds) can be made greater than the minimum dimension of a hot spot to take advantage of the improved cooling under the inlet manifold. The hot spot, which is a region of higher than average power density, such as processor cores, have dimensions on the order of about 2 to 5 mm, depending on the exact chip design. As described above, to provide an adequate pressure drop to ensure flow uniformity in the rack, to be able to use the fins aligned with the inlet manifold to provide enhanced cooling of hot spots, and to minimize thermal coupling between the inlet and outlet manifolds, which can result in preheating of the inlet fluid and reduced overall thermal performance, the minimum distance between the center of the inlet and outlet manifolds feeding a group of fins should be greater than or equal to about 3 mm.

Although exemplary embodiments of the present invention have been described in detail with reference to the accompanying drawings for the purpose of illustration and description, it is to be understood that the inventive processes and apparatus are not to be construed as limited thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. A cooler having a unitary construction comprising:
a channel portion comprising a plurality of fins on a base, the plurality of fins defining a plurality of microchannels therebetween;
at least one tapered opening formed in a set of the plurality of fins which does not extend across all the fins;
a manifold portion disposed on an edge portion of the base and covering the channel portion, the manifold portion comprising an inlet port and an outlet port which are in fluid connection with respective tapered inlet and outlet manifold channels, and distribution channels for flowing coolant from the inlet port through the microchannels and to the outlet port; and
a separator sheet comprising at least two elongated openings disposed between the channel portion and the tapered inlet and outlet manifold channels of the manifold portion, wherein distribution channels of the manifold portion are located above an active cooled portion of the plurality of fins, and wherein inlet and outlet channels of the manifold portion are located above the separator sheet.

2. The cooler of claim 1, wherein the inlet port and the outlet port disposed above respective tapered openings in the plurality of fins.

3. The cooler of claim 2, wherein the least two elongated openings have a width substantially equal to an upper width of the tapered openings and a length less than a length of the tapered openings, wherein the least two elongated openings are partially offset from one another.

4. The cooler of claim 2, wherein the least two elongated openings being aligned with a portion of the tapered openings formed in a set of the plurality of fins.

5. The cooler of claim 1, wherein the tapered opening is formed into a vertical portion of the set of the plurality of fins along a length of the fins.

6. The cooler of claim 1, wherein the manifold portion is formed as a shell.

* * * * *